(12) United States Patent
Mizuguchi et al.

(10) Patent No.: US 10,984,991 B2
(45) Date of Patent: Apr. 20, 2021

(54) SUBSTRATE PROCESSING APPARATUS

(71) Applicant: KOKUSAI ELECTRIC CORPORATION, Tokyo (JP)

(72) Inventors: Yasuhiro Mizuguchi, Toyama (JP); Shun Matsui, Toyama (JP)

(73) Assignee: KOKUSAI ELECTRIC CORPORATION, Tokyo (JP)

(*) Notice: Subject to any disclaimer, the term of this patent is extended or adjusted under 35 U.S.C. 154(b) by 0 days.

(21) Appl. No.: 16/360,796

(22) Filed: Mar. 21, 2019

(65) Prior Publication Data

US 2020/0144037 A1 May 7, 2020

(30) Foreign Application Priority Data

Nov. 5, 2018 (JP) .............................. JP2018-208138

(51) Int. Cl.
    *G06F 11/20* (2006.01)
    *H01J 37/32* (2006.01)
    *H01L 21/67* (2006.01)

(52) U.S. Cl.
    CPC .. *H01J 37/32926* (2013.01); *H01J 37/32357* (2013.01); *H01J 37/32449* (2013.01); *H01L 21/67253* (2013.01); *H01J 2237/3321* (2013.01)

(58) Field of Classification Search
    USPC .................................. 714/4.11–4.5
    See application file for complete search history.

(56) References Cited

U.S. PATENT DOCUMENTS

2002/0076492 A1* 6/2002 Loan ................... F16K 31/1262
                                                        427/255.28
2007/0094467 A1* 4/2007 Yamasaki ........... G06F 11/2082
                                                        711/162
(Continued)

FOREIGN PATENT DOCUMENTS

JP        2011146626 A      7/2011
JP        2017-103356 A     6/2017
(Continued)

OTHER PUBLICATIONS

Taiwanese Office Action dated Jan. 6, 2020 for the Taiwanese Patent Application No. 108109590.
(Continued)

*Primary Examiner* — Ilwoo Park
(74) *Attorney, Agent, or Firm* — Volpe Koenig

(57) ABSTRACT

Described herein is a technique capable of capable of managing a substrate processing apparatus efficiently. According to one aspect of the technique of the present disclosure, there is provided a substrate processing apparatus including: process performing parts configured to process a substrate based on a program; a first controller configured to process the program; and a second controller configured to control the process performing parts based on data received from the first controller, wherein the first controller is further configured to determine whether or not a first controller provided in an additional substrate processing apparatus is malfunctioning based on operation data of the first controller provided in the additional substrate processing apparatus, and to perform an alternative control for the first controller provided in the additional substrate processing apparatus when it is determined that the first controller provided in the additional substrate processing apparatus is malfunctioning.

20 Claims, 9 Drawing Sheets

(56) References Cited

U.S. PATENT DOCUMENTS

| | | | |
|---|---|---|---|
| 2015/0066185 A1* | 3/2015 | Kim | G05B 19/4184 |
| | | | 700/108 |
| 2016/0292054 A1* | 10/2016 | Wang | H04L 1/22 |
| 2017/0159181 A1 | 6/2017 | Toyoda et al. | |
| 2017/0163476 A1* | 6/2017 | Killadi | G06F 11/2005 |
| 2018/0046161 A1* | 2/2018 | Yhr | G05B 9/03 |

FOREIGN PATENT DOCUMENTS

| | | |
|---|---|---|
| JP | 2017-169464 A1 | 12/2018 |
| KR | 10-2015-0028077 A | 3/2015 |
| TW | M332259 U | 5/2008 |
| TW | M563654 U | 7/2018 |

OTHER PUBLICATIONS

Korean Office Action dated Jul. 6, 2020 for Korean Patent Application No. 10-2019-0031182.

Japanese Office Action dated Nov. 5, 2020 for Japanese Patent Application No. 2018-208138.

* cited by examiner

FIG. 5

| | FIRST CONNECTION DESTINATION | SECOND CONNECTION DESTINATION | THIRD CONNECTION DESTINATION | FOURTH CONNECTION DESTINATION | ... | $n^{th}$ CONNECTION DESTINATION |
|---|---|---|---|---|---|---|
| FIRST CONTROLLER 260a | a1 SECOND CONTROLLER 280a | b1 SECOND CONTROLLER 280b | c1 SECOND CONTROLLER 280d | d1 ——— | ⋮ | n1 ——— |
| FIRST CONTROLLER 260b | a2 SECOND CONTROLLER 280b | b2 SECOND CONTROLLER 280a | c2 ——— | d2 ——— | ⋮ | n2 ——— |
| FIRST CONTROLLER 260c | a3 SECOND CONTROLLER 280c | b3 SECOND CONTROLLER 280a | c3 SECOND CONTROLLER 280b | d3 SECOND CONTROLLER 280d | ⋮ | n3 ——— |
| FIRST CONTROLLER 260d | a4 SECOND CONTROLLER 280d | b4 SECOND CONTROLLER 280a | c4 SECOND CONTROLLER 280b | d4 ——— | ⋮ | n4 ——— |
| ... | ... | ... | ... | ... | ⋮ | ... |
| FIRST CONTROLLER 260x | aX SECOND CONTROLLER 280x | bX SECOND CONTROLLER 280a | cX SECOND CONTROLLER 280b | dX SECOND CONTROLLER 280c | ⋮ | nX SECOND CONTROLLER 280d |

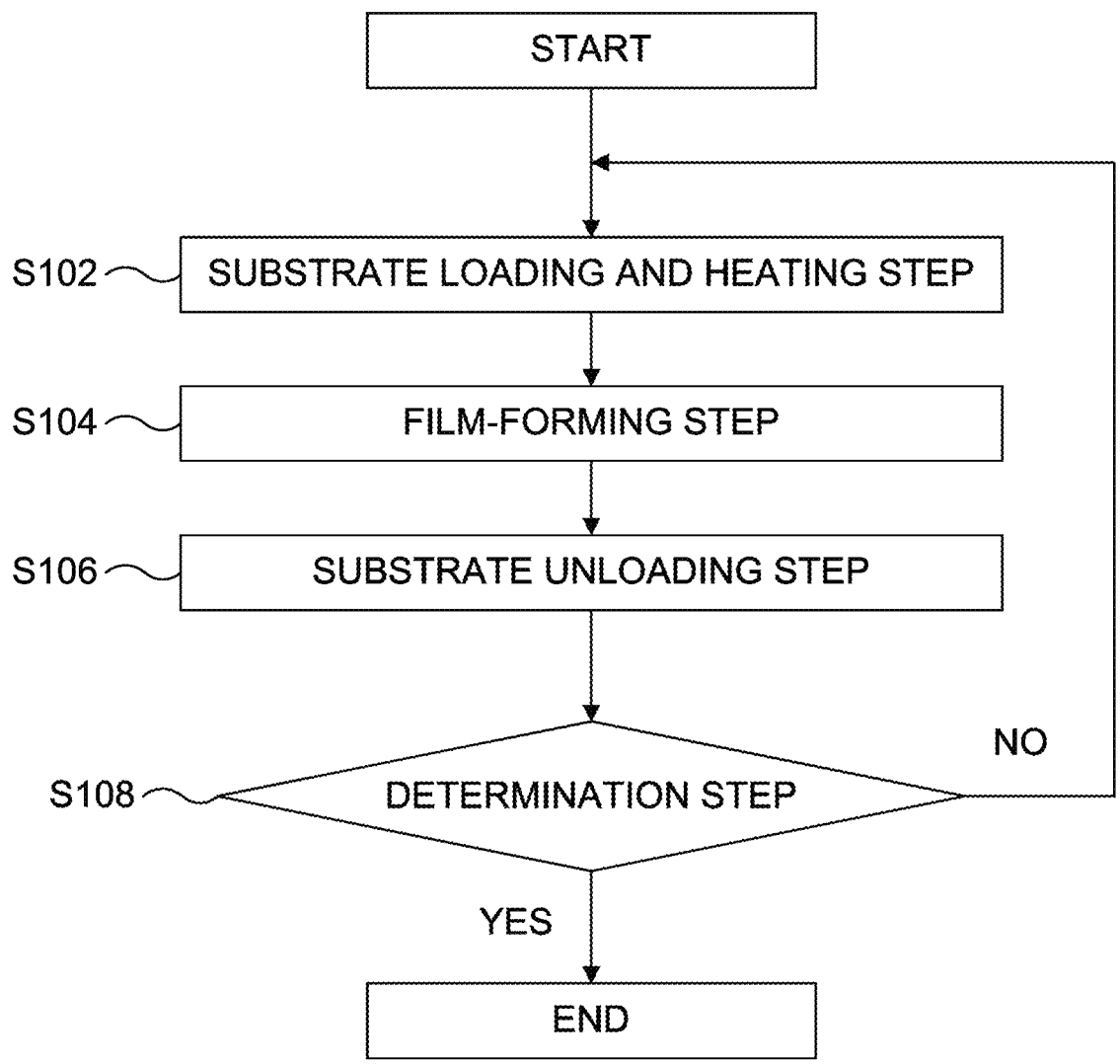

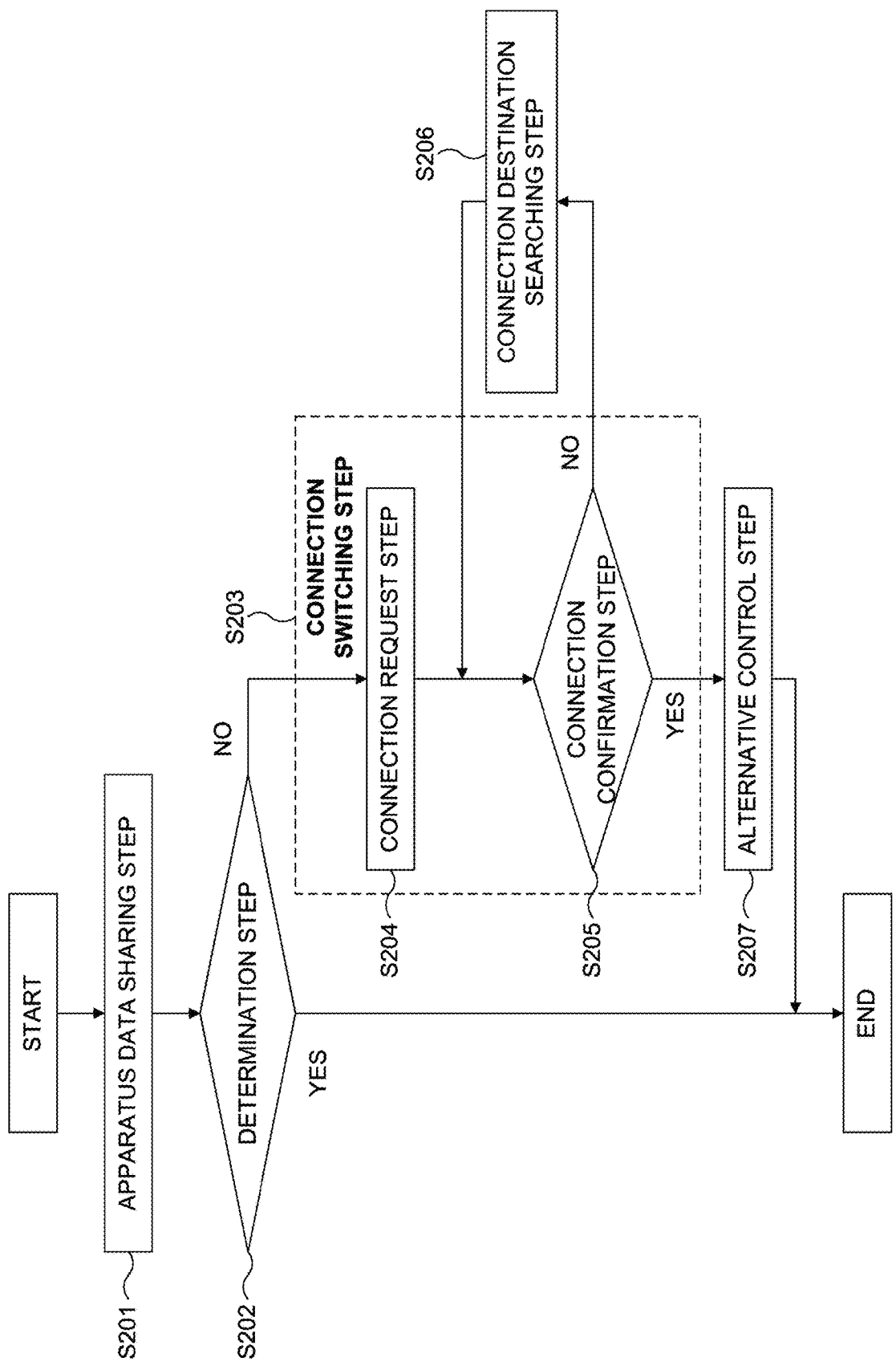

CONFIRM CONNECTION REQUEST

WOULD YOU LIKE TO REPLACE THE CONTROL OF THE SUBSTRATE PROCESSING APPARATUS 100b?

275a — YES

275b — NO

275c — CALL A PERSON IN CHARGE

SUBSTRATE PROCESSING APPARATUS

CROSS-REFERENCE TO RELATED PATENT APPLICATION

This non-provisional U.S. patent application claims priority under 35 U.S.C. § 119 of Japanese Patent Application No. 2018-208138, filed on Nov. 5, 2018, the entire contents of which are hereby incorporated by reference.

BACKGROUND

1. Field

The present disclosure relates to a substrate processing apparatus.

2. Description of the Related Art

For example, a substrate processing apparatus used in manufacturing processes of a semiconductor device may be configured as an apparatus including a module having a reactor. In the substrate processing apparatus including the module having the reactor, information such as apparatus operation information may be displayed on an input/output device constituted by components such as a display so that an apparatus administrator can confirm the information such as the apparatus operation information.

SUMMARY

Described herein is a technique capable of managing a substrate processing apparatus efficiently.

According to one embodiment of the technique of the present disclosure, there is provided a substrate processing apparatus including process performing parts configured to process a substrate based on a program; a first controller configured to process the program; and a second controller configured to control the process performing parts based on data received from the first controller, wherein the first controller is further configured to determine whether or not a first controller provided in an additional substrate processing apparatus is malfunctioning based on operation data of the first controller provided in the additional substrate processing apparatus, and to perform an alternative control for the first controller provided in the additional substrate processing apparatus when it is determined that the first controller provided in the additional substrate processing apparatus is malfunctioning.

BRIEF DESCRIPTION OF THE DRAWINGS

FIG. 5 schematically illustrates an example of apparatus connection data according to the embodiments described herein.

FIG. 6 is a flowchart schematically illustrating a substrate processing performed by the substrate processing apparatus according to the embodiments described herein.

FIG. 7 is a flowchart schematically illustrating a switching step performed by the controller according to the embodiments described herein.

FIG. 9 schematically illustrates an example of a screen of an alternative control request.

DETAILED DESCRIPTION

Figure 1:
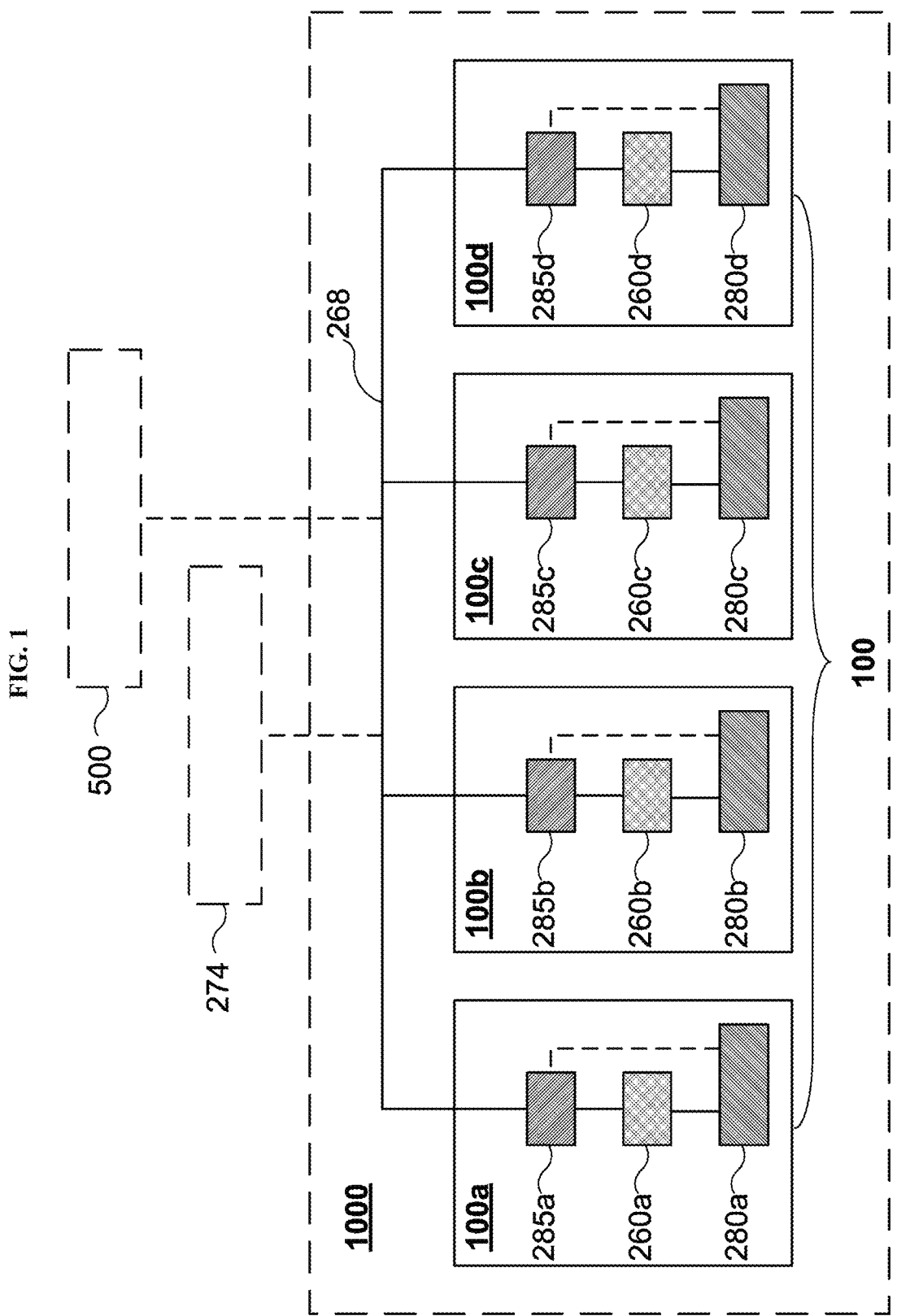
FIG. 1 schematically illustrates a configuration of a substrate processing system according to one or more embodiments described herein.

Hereinafter, one or more embodiments according to the technique will be described.

Embodiments

Hereinafter, one or more embodiments according to the technique will be described with reference to the drawings.

First, some problems to be addressed by the present disclosure will be described. When a plurality of substrate processing apparatuses is operated, at least the following problems (a) through (c) may occur. Configurations corresponding to each reference numeral will be described in detail later.

(a) If a plurality of substrate processing apparatuses 100 is operated, a first controller 260 serving as an operation part of operating components of one of the substrate processing apparatuses 100 may be provided. When the first controller 260 provided in the one of the substrate processing apparatuses 100 is down, the one of the substrate processing apparatuses 100 cannot be operated.

(b) The first controller 260 provided in the one of the substrate processing apparatuses 100 may be duplicated for the purpose of troubleshooting. In this case, when one of the duplicated pair of the first controllers 260 fails, a control is switched to the other of the duplicated pair of the first controllers 260 that has not failed. However, when the control is performed while the one of the duplicated pair of the first controllers 260 has failed, the one of the substrate processing apparatuses 100 may not be operated in some cases if the other of the duplicated pair of the first controllers 260 also fails.

(c) When the same processing is performed in the plurality of substrate processing apparatuses 100, the one of the plurality of substrate processing apparatuses 100 may be put under maintenance. After the maintenance is performed, the latest setting data may be applied to the one of the plurality of substrate processing apparatuses 100. The latest setting data is transmitted from a host apparatus 500 to the one of the plurality of substrate processing apparatuses 100. However, the latest setting data may not be set to the one of the plurality of substrate processing apparatuses 100 until the maintenance is completed.

To address the problems described above, a substrate processing system according to the embodiments is configured as described below.

(1) Configuration of Substrate Processing System

Figure 2:
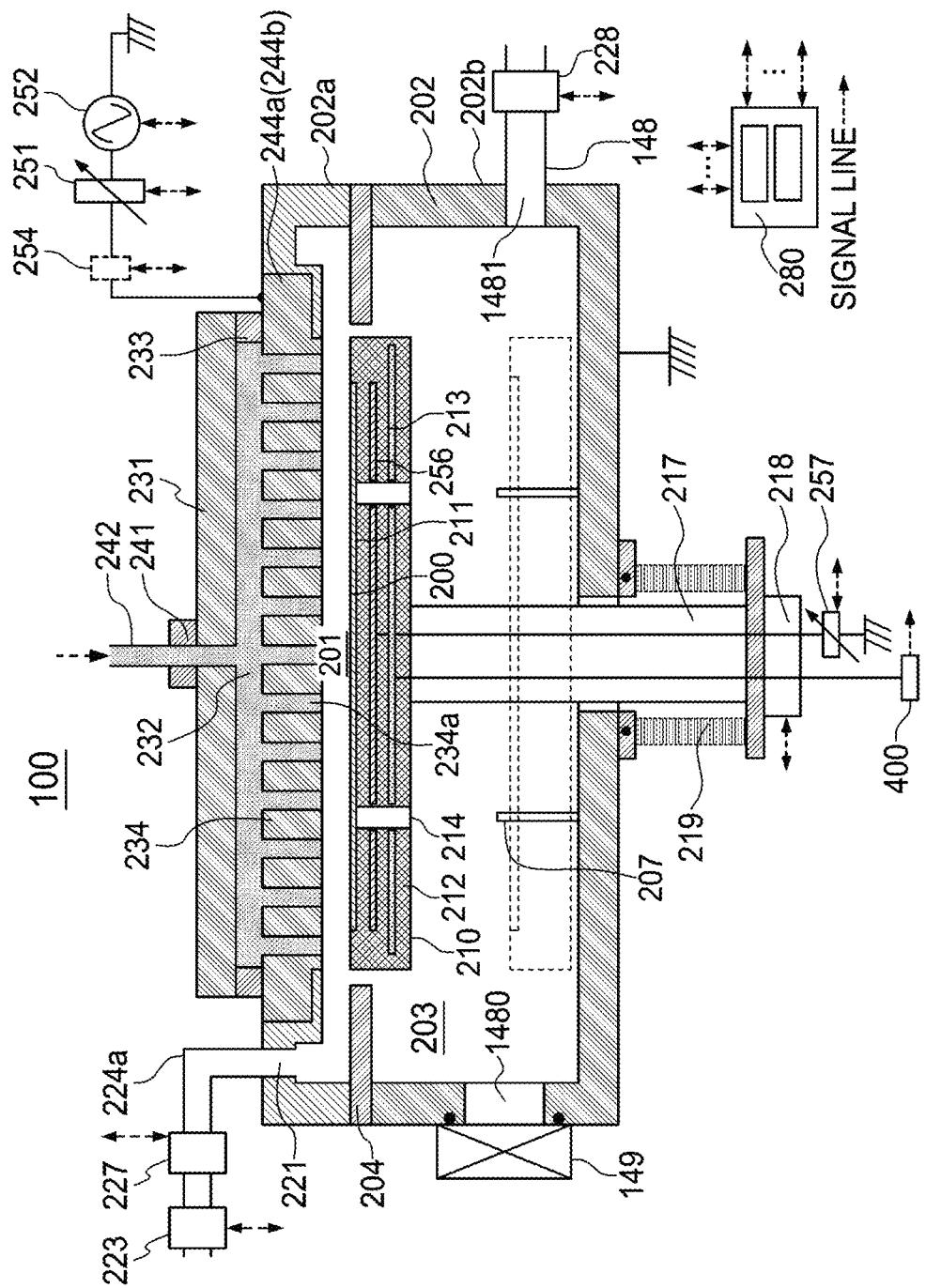
FIG. 2 schematically illustrates a configuration of a substrate processing apparatus according to the embodiments described herein.
Figure 3:
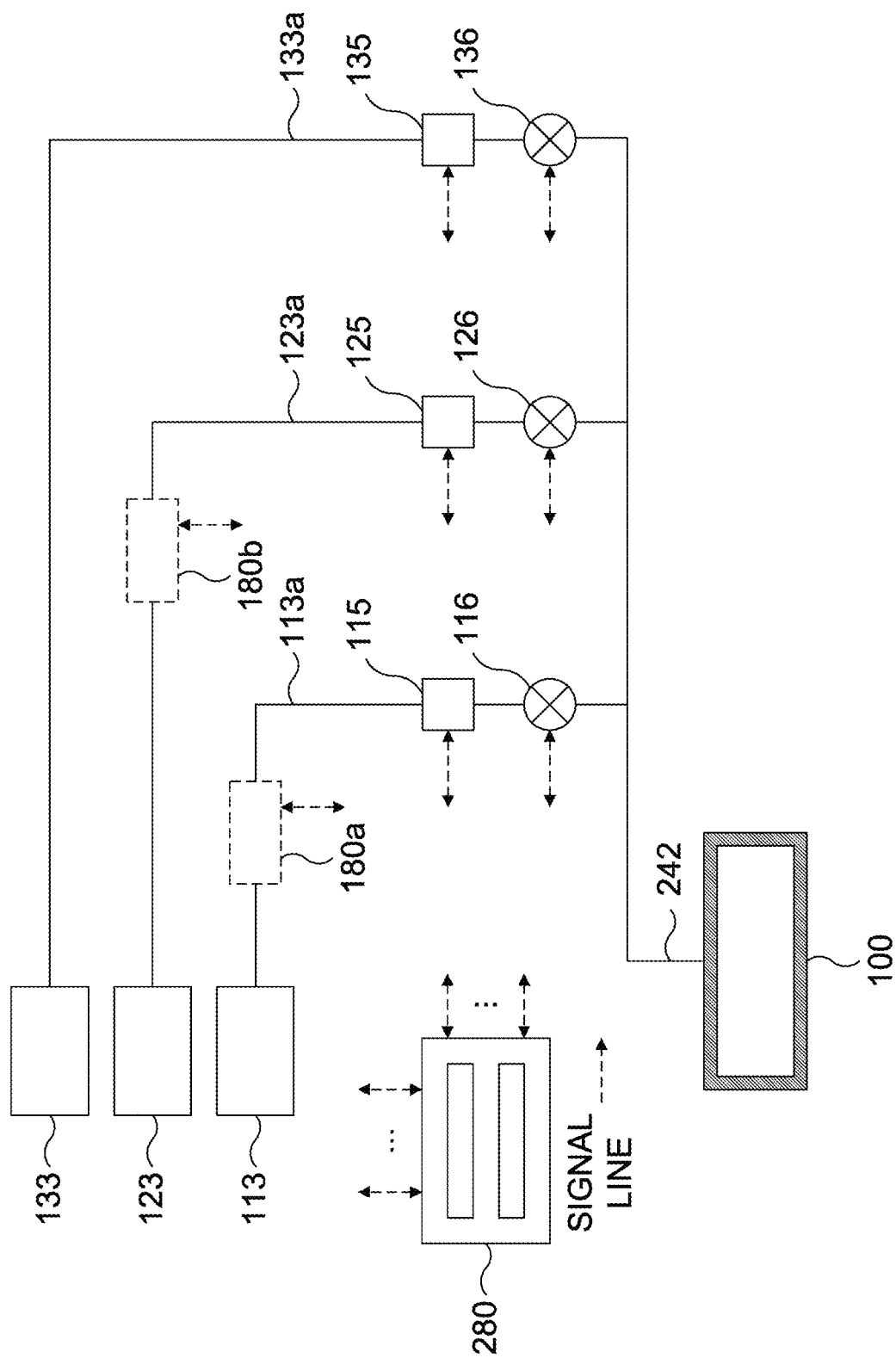
FIG. 3 schematically illustrates a configuration of a gas supply system of the substrate processing apparatus according to the embodiments described herein.
Figure 4:
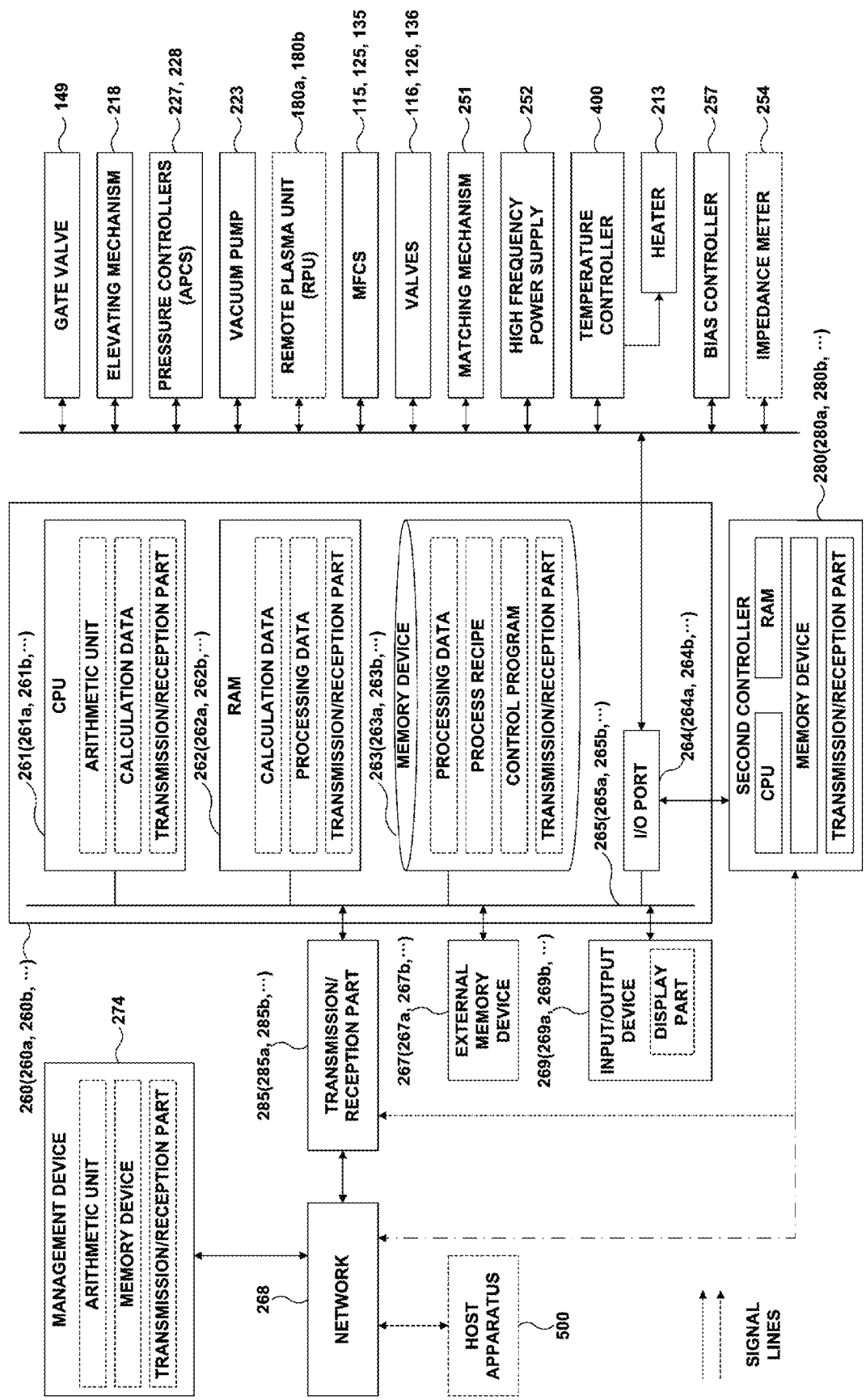
FIG. 4 is a block diagram schematically illustrating a configuration of a controller and components controlled by the controller of the substrate processing apparatus according to the embodiments described herein.

A schematic configuration of the substrate processing system according to the embodiments will be described with reference to FIG. 1, FIG. 2, FIG. 3 and FIG. 4. FIG. 1 schematically illustrates an exemplary configuration of the substrate processing system according to the embodiments described herein. FIG. 2 schematically illustrates a vertical cross-section of a substrate processing apparatus according to the embodiments described herein. FIG. 3 schematically illustrates a configuration of a gas supply system of the substrate processing apparatus according to the embodiments described herein. FIG. 4 schematically illustrates a connection relationship between components provided in the substrate processing apparatus and the first controller 260.

As shown in FIG. 1, a substrate processing system 1000 includes the plurality of substrate processing apparatuses 100 (that is, for example, a substrate processing apparatus 100a, a substrate processing apparatus 100b, a substrate processing apparatus 100c and a substrate processing apparatus 100d). Hereinafter, the substrate processing apparatuses 100a, 100b, 100c and 100d may be collectively referred to as a substrate processing apparatus 100, or each of the substrate processing apparatuses 100a, 100b, 100c and 100d may be simply referred to as the substrate processing apparatus 100. The plurality of substrate processing apparatuses may include first controllers 260 (that is, for example, a first controller 260a, a first controller 260b, a first controller 260c and a first controller 260d), second controllers 280 (that is, for example, a second controller 280a, a second controller 280b, a second controller 280c and a second controller 280d) and data transmission/reception parts 285 (that is, for example, a data transmission/reception part 285a, a data transmission/reception part 285b, a data transmission/reception part 285c, a data transmission/reception part 285d). Hereinafter, the first controllers 260a, 260b, 260c and 260d may be collectively referred to as a first controller 260, or each of the first controllers 260a, 260b, 260c and 260d may be simply referred to as the first controller 260. The same also applies to the second controllers 280a, 280b, 280c and 280d and the data transmission/reception parts 285a, 285b, 285c and 285d. The first controller 260 is configured to execute the operations of the components of the substrate processing apparatus 100 through the second controller 280. For example, the first controller 260a is configured to execute the operations of the components of the substrate processing apparatus 100a through the second controller 280a. In addition, the first controller 260 is configured to transmit and receive data to and from the first controller 260 and the second controller 280 of another processing apparatus 100 through the data transmission/reception part 285 and a network 268 electrically connected to the data transmission/reception part 285. For example, the first controller 260a is configured to transmit and receive data to and from the first controller 260b and the second controller 280b of the processing apparatus 100b through the data transmission/reception part 285a and the network 268. The second controller 280 is configured to control the operations of the components provided in the substrate processing apparatus 100. The first controller 260, the second controller 280 and the data transmission/reception part 285 are configured to communicate with each other. In addition, the first controller 260 and the second controller 280 are electrically connected to the network 268. While the embodiments will be described by way of an example in which the first controller 260 and the second controller 280 are electrically connected through the data transmission/reception part 285, the first controller 260 and the second controller 280 may be connected directly to the network 268. With the configuration described above, the first controller 260 provided in the substrate processing apparatus 100 can operate (control) the second controller 280 provided in another substrate processing apparatus 100. For example, the first controller 260a provided in the substrate processing apparatus 100a can operate (control) the second controller 280b provided in the substrate processing apparatus 100b.

Hereinafter, a schematic configuration of the substrate processing apparatus 100 will be described with reference to FIG. 2.

(2) Configuration of Substrate Processing Apparatus

The substrate processing apparatus 100 includes, for example, an apparatus of forming an insulating film on a substrate 200, and is configured as a single wafer type substrate processing apparatus as shown in FIG. 2. For example, an example in which the substrate processing apparatus 100 is the substrate processing apparatus 100a will be described. Since the other substrate processing apparatuses 100b, 100c and 100d have the same configuration as the substrate processing apparatus 100a, detailed description of the other substrate processing apparatuses 100b, 100c and 100d will be omitted. The components provided in the substrate processing apparatus 100 is configured as one of process performing parts configured to process the substrate 200.

As shown in FIG. 2, the substrate processing apparatus 100 includes a process vessel 202. For example, the process vessel 202 is a flat and sealed vessel having a circular horizontal cross-section. The process vessel 202 is made of a metal material such as aluminum (Al) and stainless steel (SUS) or quartz. A process chamber 201 where the substrate 200 such as a silicon wafer is processed and a transfer chamber 203 are provided in the process vessel 202. The process vessel 202 is constituted by an upper vessel 202a and a lower vessel 202b. A partition part (also referred to as a "partition plate") 204 is provided between the upper vessel 202a and the lower vessel 202b. A space surrounded by the upper vessel 202a and above the partition part 204 is referred to as the process chamber 201. A space surrounded by the lower vessel 202b and in the vicinity of a gate valve 149 is referred to as the transfer chamber 203.

A substrate loading/unloading port 1480 is provided on a side surface of the lower vessel 202b adjacent to the gate valve 149. The substrate 200 is moved between a vacuum transfer chamber (not shown) and the transfer chamber 203 through the substrate loading/unloading port 1480. Lift pins 207 are provided at the bottom of the lower vessel 202b. The lower vessel 202b is electrically grounded.

A substrate support 210 capable of supporting the substrate 200 is provided in the process chamber 201. The substrate support 210 mainly includes a substrate support table 212 having a substrate placing surface 211 on which the substrate 200 is placed and a heater 213 serving as a heating source. Through-holes 214 penetrated by the lift pins 207 are provided at the substrate support table 212 corresponding to the locations of the lift pins 207. In addition, the heater 213 is electrically connected to a temperature controller 400. A temperature of the heater 213 is controlled by the temperature controller 400. The temperature controller 400 is configured to transmit information of the heater 213 to the second controller 280. In addition, a bias electrode 256 configured to apply a bias to the substrate 200 or the process chamber 201 may be provided in the substrate support table 212. The bias electrode 256 is electrically connected to a bias controller 257. The bias controller 257 is configured to adjust the bias. The bias controller 257 is configured to transmit and receive bias data to and from the second controller 280.

The substrate support table 212 is supported by a shaft 217. The shaft 217 penetrates the bottom of the process vessel 202. The shaft 217 is connected to an elevating mechanism 218 outside the process vessel 202. The substrate 200 placed on the substrate placing surface 211 of the substrate support table 212 may be elevated and lowered by operating the elevating mechanism 218 by elevating and lowering the shaft 217 and the substrate support table 212. A bellows 219 covers a lower end portion of the shaft 217 to maintain the process chamber 201 airtight. The elevating mechanism 218 may be configured to transmit and receive height data (position data) of the substrate support table 212 to and from the second controller 280. At least two or more of the positions of the substrate support table 212 may be set as the height data (position data) of the substrate support table 212. For example, a first processing position and a second processing position may be set as the height data of the substrate support table 212. The first processing position and the second processing position are configured to be adjustable, respectively.

When the substrate 200 is transferred, the substrate support table 212 is moved to a substrate transfer position. When a first process is performed on the substrate 200, the substrate support table 212 is moved to the first processing position (also referred to as a "substrate processing position") indicated by a solid line in FIG. 2. When a second process is performed on the substrate 200, the substrate support table 212 is moved to the second processing position indicated by a broken line in FIG. 2. When the substrate support table 212 is at the substrate transfer position, upper end portions of the lift pins 207 protrude from the substrate placing surface 211.

Specifically, when the substrate support table 212 is lowered to the substrate transfer position, the upper end portions of the lift pins 207 protrude from an upper surface of the substrate placing surface 211, and the lift pins 207 support the substrate 200 from thereunder. When the substrate support table 212 is elevated to the substrate processing position, the lift pins 207 are buried from the upper surface of the substrate placing surface 211 and the substrate placing surface 211 supports the substrate 200 from thereunder. Since the lift pins 207 are in direct contact with the substrate 200, the lift pins 207 are preferably made of a material such as quartz and alumina.

<Exhaust System>

A first exhaust port 221, which is a part of a first exhaust system (also referred to as a first exhaust mechanism) capable of exhausting an inner atmosphere of the process chamber 201, is provided at a side surface of the process chamber 201 (that is, a side surface of the upper vessel 202a). An exhaust pipe 224a is connected to the first exhaust port 221. A vacuum pump 223 and a pressure controller 227 such as an APC (Automatic Pressure Controller) configured to adjust an inner pressure of the process chamber 201 to a predetermined pressure are connected to the exhaust pipe 224a. The first exhaust system (first exhaust line) is constituted mainly by the first exhaust port 221, the exhaust pipe 224a and the pressure controller 227. The first exhaust system may further include the vacuum pump 223. A second exhaust port 1481 configured to exhaust an inner atmosphere of the transfer chamber 203 is provided at a side surface of the transfer chamber 203. An exhaust pipe 148 is connected to the second exhaust port 1481. A pressure controller 228 configured to adjust an inner pressure of the transfer chamber 203 to a predetermined pressure is electrically connected to the exhaust pipe 1482. In addition, the inner atmosphere of the process chamber 201 may be exhausted through the transfer chamber 203. The pressure controller 227 is configured to transmit and receive pressure data or valve opening degree data to and from the second controller 280. The vacuum pump 223 is configured to transmit data such as ON/OFF data and load data of the vacuum pump 223 to the second controller 280.

<Gas Introduction Port>

A cover 231 is provided on an upper surface (ceiling) of a shower head 234 provided above the process chamber 201. A gas introduction port 241 configured to supply various gases into the process chamber 201 is provided at the cover 231. A detailed configuration of each gas supply system (gas supply mechanism) connected to the gas introduction port 241 will be described later.

<Gas Dispersion Mechanism>

The shower head 234, which is a gas dispersion mechanism, includes a buffer chamber 232 and a dispersion plate 244a. The dispersion plate 244a may include a first electrode 244b which is a part of an activation mechanism. Holes 234a for dispersing and supplying a gas to the substrate 200 is provided at the dispersion plate 244a. The shower head 234 is provided between the gas introduction port 241 and the process chamber 201. The gas supplied through the gas introduction port 241 is supplied to the buffer chamber 232 of the shower head 234 and is then supplied to the process chamber 201 through the holes 234a. The buffer chamber 234 may also be referred as a "dispersion part".

When the dispersion plate 244a includes the first electrode 244b, the first electrode 244b may be made of a conductive metal. The first electrode 244b is a part of the activation mechanism (also referred to as "excitation mechanism" or "plasma generator") for exciting the gas. An electromagnetic wave (high frequency power or microwave) may be applied to the first electrode 244b. When the cover 231 is made of a conductive material, an insulating block 233 is provided between the cover 231 and the first electrode 244b. The insulating block 233 electrically insulates the cover 231 from the first electrode 244b.

<Activation Mechanism (Plasma Generator)>

The activation mechanism will be described. When the dispersion plate 244a includes the first electrode 244b, a matching mechanism 251 and a high frequency power supply 252, which are a part of the activation mechanism, are electrically connected to the first electrode 244b. The matching mechanism 251 and the high frequency power supply 252 are configured to supply the electromagnetic wave (high frequency power or microwave) to the first electrode 244b. When the electromagnetic wave is supplied to the first electrode 244b, the gas supplied into the process chamber 201 is activated. The first electrode 244b is capable of generating capacitively coupled plasma. Specifically, the first electrode 244b may be a conductive plate supported by the upper vessel 202a. The activation mechanism is constituted by at least the first electrode 244b, the matching mechanism 251 and the high frequency power supply 252. An impedance meter 254 may be provided between the first electrode 244b and the high frequency power supply 252. The matching mechanism 251 and the high frequency power supply 252 may be feedback-controlled based on the impedance measured by the impedance meter 254. The high frequency power supply 252 may transmit or receive power data to or from the second controller 280. The matching mechanism 251 is configured to transmit and receive matching data including data representing traveling wave and reflected wave to or from the second controller 280. The impedance meter 254 is configured to transmit and receive impedance data to and from the second controller 280.

<Gas Supply System>

A common gas supply pipe 242 is connected to the gas introduction port 241. Various gases are supplied into the shower head 234 through the common gas supply pipe 242 and the gas introduction port 241.

As shown in FIG. 3, gas supply pipes of a gas supply system are connected to the common gas supply pipe 242. Specifically, a first gas supply pipe 113a, a second gas supply pipe 123a and a third gas supply pipe 133a are connected to the common gas supply pipe 242.

A first element-containing gas (also referred to as a "first process gas") is mainly supplied by a first gas supply system (also referred to as a "first gas supply mechanism") which includes the first gas supply pipe 113a. A second element-containing gas (also referred to as a "second process gas") is mainly supplied by a second gas supply system (also referred to as a "second gas supply mechanism") which includes the second gas supply pipe 123a. A third element-containing gas is mainly supplied by a third gas supply system (also referred to as a "third gas supply mechanism") which includes the third gas supply pipe 133a.

<First Gas Supply System>

A first gas supply source 113, a mass flow controller (MFC) 115 serving as a flow rate controller (flow rate control mechanism) and a valve 116 serving as an opening/closing valve are provided at the first gas supply pipe 113a in order from an upstream side to a downstream side of the first gas supply pipe 113a.

The first element-containing gas is supplied to the shower head 234 through the first gas supply pipe 113a provided with the MFC 115 and the valve 116 and the common gas supply pipe 242.

According to the embodiments, the first element-containing gas is one of process gases. The first element-containing gas may include a gas containing silicon (Si) (that is, silicon-containing gas). For example, a gas such as hexachlorodisilane ($Si_2Cl_2$, abbreviated as HCDS) gas may be used as the first element-containing gas (silicon-containing gas).

The first gas supply system is constituted mainly by the first gas supply pipe 113a, the MFC 115 and the valve 116.

The first gas supply system may further include at least one of the first gas supply source 113 and a remote plasma unit (also referred to as a "remote plasma mechanism") (RPU) 180a capable of activating the first process gas.

<Second Gas Supply System>

A second gas supply source 123, a mass flow controller (MFC) 125 and a valve 126 are provided at the second gas supply pipe 123a in order from an upstream side to a downstream side of the second gas supply pipe 123a.

The second element-containing gas is supplied to the shower head 234 through the second gas supply pipe 123a provided with the MFC 125 and the valve 126 and the common gas supply pipe 242.

According to the embodiments, the second element-containing gas is one of the process gases. The second element-containing gas may include a gas containing nitrogen (N) (that is, nitrogen-containing gas). For example, a gas such as ammonia ($NH_3$) gas and nitrogen ($N_2$) gas may be used as the second element-containing gas (nitrogen-containing gas).

The second gas supply system is constituted mainly by the second gas supply pipe 123a, the MFC 125 and the valve 126.

The second gas supply system may further include at least one of the second gas supply source 123 and a remote plasma unit (also referred to as a "remote plasma mechanism") (RPU) 180b capable of activating the second process gas.

<Third Gas Supply System>

A third gas supply source 133, a mass flow controller (MFC) 135 and a valve 136 are provided at the third gas supply pipe 133a in order from an upstream side to a downstream side of the third gas supply pipe 133a.

An inert gas serving as the third element-containing gas is supplied to the shower head 234 through the third gas supply pipe 133a provided with the MFC 135 and the valve 136 and the common gas supply pipe 242.

The inert gas is unlikely to react with the first process gas. For example, a gas such as nitrogen ($N_2$) gas, argon (Ar) gas and helium (He) gas may be used as the inert gas.

The third gas supply system is constituted mainly by the third gas supply pipe 133a, the MFC 135 and the valve 136.

According to the embodiments, the MFCs 115, 125 and 135 and the valves 116, 126 and 136 constituting the first gas supply system, the second gas supply system and the third gas supply system, respectively, may communicate with the second controller 280 to transmit and receive the data described below:

MFCs: data representing the flow rates; and

Valves: data representing the opening degree of the valves.

The first gas supply system and the second gas supply system may further include vaporizers (not shown) and the RPUs 180a and 180b, respectively. The vaporizers and the RPUs 180a and 180b may communicate with the second controller 280 to transmit and receive the data described below:

Vaporizer: data representing the amount of vaporization; and

RPU: data representing the electrical power.

<First Controller and Second Controller>

Hereinafter, the first controller 260 and the second controller 280 will be described. As shown in FIG. 4, the substrate processing apparatus 100 includes the first controller 260 and the second controller 280 serving as a controller (control device) configured to control the operations of the components of the substrate processing apparatus 100.

FIG. 4 is a block diagram schematically illustrating configurations of the first controller 260 and the second controller 280 and components electrically connected to the first controller 260 and the second controller 280 such as a management device 274, the network 268 and the host apparatus 500. For example, the first controller 260a and the second controller 280a provided in the substrate processing apparatus 100a will be described. Since the other substrate processing apparatuses 100b, 100c and 100d have the same configuration, detailed description of the other first controllers 260b, 260c and 260d and the other second controllers 280b, 280c and 280d will be omitted.

<First Controller>

The first controller 260a may be embodied by a computer having a CPU (Central Processing Unit) 261a, a RAM (Random Access Memory) 262a, a memory device 263a and an I/O port 264a. The RAM 262a, the memory device 263a and the I/O port 264a may exchange data with the CPU 261a via an internal bus 265a. Components such as the data transmission/reception part (hereinafter, also referred to simply as a "transmission/reception part") 285a, an external memory device 267a and an input/output device 269a may be electrically connected to the internal bus 265a. The first controller 260a may further include at least one of the transmission/reception part 285a, the external memory device 267a and the input/output device 269a.

The memory device 263a may be embodied by components such as a flash memory and a HDD (Hard Disk Drive). Apparatus data is readably stored (recorded) in the memory device 263a.

The apparatus data includes at least one of the following data. For example, data such as a control program for controlling the operation of the substrate processing apparatus 100; a process recipe in which information such as the sequences and conditions of a substrate processing described later is stored; and calculation data and processing data generated in the process of setting the process recipe used for processing the substrate 200; schedule data; operation data; apparatus connection data; internal connection setting data; and data related to the substrate 200 (also referred to as a "wafer data") may be included in the apparatus data.

In the present specification, the operation data refers to data such as at least one of: a load state, the number of errors occurred, an operation time and a temperature of at least one of the CPU 261a, the RAM 262a and the memory device 263a provided in the first controller 260a.

The apparatus connection data refers to data representing a connection relationship between the substrate processing apparatus 100 and the network 268. For example, the apparatus connection data refers to date representing the connection relationship between the following: (i) the first controller 260 and the second controller 280 included in the substrate processing apparatus 100; and (ii) the first controller 260 and the second controller 280 included in another substrate processing apparatus 100 that can be electrically connected to the substrate processing apparatus 100. For example, the apparatus connection data is constituted by data representing the connection relationship as shown in FIG. 5. As shown in FIG. 5, a first connection destination, a second connection destination, a third connection destination, a fourth connection destination through an $n^{th}$ connection destination to which first controllers 260a, 260b, 260c, 260d through 260x can be electrically connected, respectively, are stored (written) in a1, a2, a3, a4 through aX, b1, b2, b3, b4 through bX, n1, n2, n3, n4 through nX of a data table. The symbol X represents the number of the substrate processing apparatuses 100, and the symbols n and N are natural numbers. The values of X, n and N may be increased appropriately. For example, the values of X, n and N can be increased according to the number of the substrate processing apparatuses 100 provided in the substrate processing system 1000. In addition, the substrate processing apparatuses 100 may be provided in plural number without constituting the substrate processing system 1000.

According to the embodiments, as shown in FIG. 5, the second controller 280 provided in the same substrate processing apparatus 100 is set as the first connection destination of the first controller 260 and is set to be capable of alternative control for the second or later connection destination. Specifically, the connection destinations are set as follows. The first controller 260a is electrically connected to the second controller 280a (that is, "a1" in FIG. 5), and is set to be capable of alternative control for the second controller 280b (that is, "b1" in FIG. 5) and the second controller 280d (that is, "c1" in FIG. 5). The first controller 260b is electrically connected to the second controller 280b (that is, "a2" in FIG. 5), and is set to be capable of alternative control for the second controller 280a (that is, "b2" in FIG. 5). The first controller 260c is electrically connected to the second controller 280c (that is, "a3" in FIG. 5), and is set to be capable of alternative control for the second controller 280a (that is, "b3" in FIG. 5), the second controller 280b (that is, "c3" in FIG. 5), and the second controller 280d (that is, "d3" in FIG. 5). A connection destination can be added to a data table without connection destination (that is, a data table in which no connection destination is written) whenever necessary during a connection destination searching step S206 to be described later. In addition, when another substrate processing apparatus 100 or another first controller 260 is electrically connected to the network 268, a connectable device may be added as a connection destination in the data table by searching the network 268. In the embodiments, the connectable device refers to the first controller 260a or a control device which can replace the first controller 260. In addition, specific information of the first controller 260 includes at least one of an IP address and access protocol (connection protocol) data.

The internal connection setting data refers to data representing the connection relationships of the components (process performing parts) provided in the substrate processing apparatus 100. Specific information of the internal connection setting data includes at least one of the IP address and the access protocol (connection protocol) data.

The wafer data refers to data attached to the substrate (also referred to as a "wafer") 200 transferred to the substrate processing apparatus 100.

The schedule data refers to data representing a process schedule of the substrate 200.

The process recipe is a program that is executed by the first controller 260 to obtain a predetermined result by performing sequences of the substrate processing described later. Hereinafter, the process recipe, the control program and the data described above may be collectively referred to simply as a "program". In the present specification, the term "program" may refer to only the process recipe, only the control program, or both of them.

The CPU 261a, which is an arithmetic unit, is configured to read and execute the control program stored in the memory device 263a, and read the process recipe stored in the memory device 263a in accordance with an instruction such as an operation command inputted via the input/output device 269a. The CPU 261a is capable of computing the calculation data by comparing a value inputted from the transmission/reception part 285a with the process recipe or control data stored in the memory device 263a. The CPU 261a may select the process recipe or the processing data based on the calculation data. The calculation data may be transmitted and received to and from the second controller 280a described later through at least one of the internal bus 265a, the I/O port 264a, and the transmission/reception part 285a. A transmission/reception part provided in the CPU 261a may transmit and receive control information according to the process recipe to and from the components of the substrate processing apparatus 100 to control the operations of the components.

The RAM 262a functions as a memory area (work area) in which the program or the data such as the calculation data and the processing data read by the CPU 261a are temporarily stored.

The I/O port 264a is electrically connected to the second controller 280a, which will be described later.

The input/output device 269a may include a display part constituted by a display or a touch panel.

The transmission/reception part 285a is configured to communicate with the host apparatus 500, the management device 274 and at least one of the first controller 260a and the second controller 280a via the network 268.

<Second Controller>

The second controller 280a is electrically connected to the components (process performing parts) of the substrate processing apparatus 100. For example, the second controller 280a is electrically connected to the components such as the gate valve 149, the elevating mechanism 218, the temperature controller 400, the pressure controllers 227 and 228, the vacuum pump 223, the matching mechanism 251, the high frequency power supply 252, the MFCs 115, 125 and 135, the valves 116, 126 and 136 and the bias controller 257. The second controller 280a may also be electrically connected to the impedance meter 254, the RPUs 180a and 180b, a vacuum transfer robot (not shown) and an atmospheric transfer robot (not shown). In addition, the second controller 280a may be electrically connected to at least one of the transmission/reception part 285a and the network 268.

The second controller 280a may be configured to control the operations of the components of the substrate processing apparatus 100 according to the data of the process recipe (program) calculated (processed) by the first controller 260a. For example, the second controller 280a may be configured to control the operations, according to the process recipe, such as an opening/closing operation of the gate valve 149, an elevating/lowering operation of the elevating mechanism 218, an operation of supplying electrical power to the temperature controller 400, an operation of adjusting the temperature of the substrate support table 212 by the temperature controller 400, pressure adjusting operations of the pressure controllers 227 and 228, an ON/OFF control of the vacuum pump 223, gas flow rate adjusting operations of the MFCs 115, 125 and 135, gas activation operations of the RPUs 180a and 180b, ON/OFF control operations of the gas by the valves 116, 126 and 136, a matching operation of the electrical power of the matching mechanism 251, an operation of controlling the electrical power of the high frequency power supply 252, a control operation of the bias controller 257, a matching operation of the matching mechanism 251 based on the data measured by the impedance meter 254 and an operation of controlling the electrical power of the high frequency power supply 252 based on the data measured by the impedance meter 254.

The first controller 260a and the second controller 280a are not limited to a dedicated computer. The first controller 260a and the second controller 280a may be embodied by a general-purpose computer. The first controller 260a and the second controller 280a according to the embodiments may be embodied by preparing the external memory device 267a (for example, a magnetic tape, a magnetic disk such as a flexible disk and a hard disk, an optical disk such as a CD and a DVD, a magneto-optical disk such as MO, a semiconductor memory such as a USB memory and a memory card), and installing the program onto the general-purpose computer using the external memory device 267a. The method of providing the program to the computer is not limited to the external memory device 267a. For example, the program may be directly provided to the computer by a communication means such as the transmission/reception part 285a and the network 268 (Internet and a dedicated line) instead of the external memory device 267a. The memory device 263a and the external memory device 267a may be embodied by a computer-readable recording medium. Hereafter, the memory device 263a and the external memory device 267a are collectively referred to as recording media. In the present specification, the term "recording media" may refer to only the memory device 263a, only the external memory device 267a, or both of them.

In the present specification, "electrically connected" means that the components are connected by physical electrical cables or the components are in communication with one another to transmit and receive signals (electronic data) to and from one another directly or indirectly.

(2) Substrate Processing

Hereinafter, an exemplary sequence of the substrate processing of forming an insulating film on the substrate 200, which is a part of the manufacturing processes of the semiconductor device, will be described with reference to FIG. 6. The exemplary sequence of substrate processing is performed by using the above-described substrate processing apparatus 100. For example, a silicon nitride film (SiN film) serving as a nitride film is formed as the insulating film according to the exemplary sequence of substrate processing. In the following descriptions, in the exemplary sequence of the substrate processing, the components of the substrate processing apparatus 100 are controlled by the first controller 260a and the second controller 280a.

Hereinafter, the substrate processing will be described.

<Substrate Loading and Heating Step S102>

Hereinafter, a substrate loading and heating step S102 will be described. In the substrate loading and heating step S102, the substrate 200 is transferred (loaded) into the process vessel 202. After the substrate 200 is loaded into the process vessel 202, the vacuum transfer robot (not shown) is retracted to the outside of the process vessel 202, and the gate valve 149 is closed to seal to seal the process vessel 202 hermetically. Thereafter, by elevating the substrate support table 212, the substrate 200 is placed on the substrate placing surface 211 of the substrate support table 212. By further elevating the substrate support table 212, the substrate 200 is elevated to a position for processing the substrate 200 (substrate processing position) in the process chamber 201 described above.

After the substrate 200 is loaded into the transfer chamber 203 and elevated to the substrate processing position in the process chamber 201, the gate valve 149 is closed. As a result, the exhaust of the transfer chamber 203 through the exhaust pipe 148 is terminated. In addition, by opening the APC (that is, the pressure controller) 227, the process chamber 201 is enabled to communicate with the vacuum pump 223. The APC 227 controls the exhaust flow rate of the process chamber 201 by the vacuum pump 223 by adjusting the conductance of the exhaust pipe 224a. The inner pressure of the process chamber 201 is thereby maintained at a predetermined pressure (for example, a high vacuum ranging from $10^{-5}$ Pa to $10^{-1}$ Pa).

In the substrate loading and heating step S102, the inner pressure of the process chamber 201 is adjusted to the predetermined pressure and a surface temperature of the substrate 200 is adjusted to a predetermined temperature. The surface temperature of the substrate 200 may range, for example, from room temperature to 500° C., preferably from room temperature to 400° C. The inner pressure of the process chamber 201 may range, for example, from 50 Pa to 5,000 Pa.

<Film-Forming Step S104>

Hereinafter, a film-forming step S104 will be described. After the substrate 200 is elevated to the substrate processing position in the process chamber 201, the film-forming step S104 is performed by the substrate processing apparatus 100. In the film-forming step S104, a film is formed on the substrate 200 according to the process recipe by supplying the first process gas (first element-containing gas) and the second process gas (second element-containing gas) different from the first process gas into the process chamber 201.

In the film-forming step S104, a CVD (chemical vapor deposition) process may be performed by supplying the first process gas and the second process gas into the process chamber 201 simultaneously, or a cyclic (alternate supply) process may be performed by alternately performing the steps of supplying the first process gas and the second process gas at least once. In addition, the remote plasma unit (remote plasma mechanism) 180b may be activated when the second process gas in a plasma state is supplied the process chamber 201. In addition, a process such as a heat treatment process and a modification process by supplying the first process gas or the second process gas may be performed as a part of the substrate processing.

<Substrate Unloading Step S106>

Hereinafter, a substrate unloading step S106 will be described. After the film-forming step S104 is completed, the substrate unloading step S106 is performed by the substrate processing apparatus 100. In the substrate unloading step S106, the processed substrate 200 is transferred (unloaded) out of the process vessel 202 in the order reverse to that of the substrate loading and heating step S102. Subsequent to a determination step S108 described later, an unprocessed substrate 200 waiting for the next process may be loaded into the process vessel 202 in the sequence same as that of the substrate loading and heating step S102. The loaded substrate 200 will be subject to the film-forming step S104 thereafter.

<Determination Step S108>

Hereinafter, the determination step S108 will be described. After the substrate unloading step S106 is completed, in the determination step S108, the substrate processing apparatus 100 (that is, the first controller 260a or the second controller 280a) determines whether a cycle including the substrate loading and heating step S102, the film-forming step S104 and the substrate unloading step S106 has been performed a predetermined number of times. When it is determined, in the determination step S108, that the cycle has not been performed the predetermined number of times ("NO" in FIG. 6), the substrate loading and heating step S102, the film-forming step S104 and the substrate unloading S106 are performed again to process the unprocessed substrate 200. When it is determined, in the determination step S108, that the cycle has been performed the predetermined number of times ("YES" in FIG. 6), the substrate processing is terminated.

The following steps shown in FIG. 7 may be performed before or after the substrate processing. FIG. 7 is a flowchart schematically illustrating a switching step performed by the controller such as the first controller 260 and the second controller 280. The following steps may also be performed during the substrate processing, or may be performed in parallel with the substrate processing for a predetermined period. The following steps are performed among the plurality of substrate processing apparatuses 100. In the following description, the following steps will be described by way of an example in which the following steps are performed between the first controller 260a and the second controller 280a of the substrate processing apparatus 100a and the first controller 260b and the second controller 280b of the substrate processing apparatus 100b. However, the following steps may be performed for another combination of the substrate processing apparatuses 100.

<Apparatus Data Sharing Step S201>

A sharing process of the latest apparatus data kept by the first controller 260 is performed among the substrate processing apparatuses 100.

Specifically the sharing process of the apparatus data refers to, for example, a process of copying (backing up) data kept (stored) in the memory device 263a or in the RAM 262a of the first controller 260a of the substrate processing apparatus 100a to the memory device 263 or the RAM 262a of first controller 260 of the another substrate processing apparatuses 100 such as the memory device 263b or the RAM 262b of first controller 280b of the substrate processing apparatuses 100. For example, when the types of data included in the apparatus data are numerous or when the capacity of the apparatus data is large, the apparatus data may be transmitted and received in a divided manner by dividing the apparatus data to be transmitted and received instead of transmitting and receiving all of the apparatus data by a single communication. In addition, transmission/reception timings may vary depending on the type of the apparatus data. For example, the operation data may be periodically transmitted and received, and the process recipe may be transmitted and received when the process recipe is updated or added.

In the present specification, the apparatus data sharing step S201 may also be referred to as a monitoring step S201.

<Determination Step S202>

Subsequently, a determination step S202 is performed to determine whether or not the operation data includes predetermined contents. For example, the determination step S202 is performed based on at least one of the following determination conditions (A) to (E).

<Example of Determination Condition>

(A) It is determined whether or not the operation data exceeds a predetermined first value.

(B) It is determined whether or not the operation data is lower than a predetermined second value.

(C) It is determined whether or not the operation data includes predetermined contents.

(D) It is determined whether or not the operation data has been acquired.

When at least one of the determination conditions is not satisfied, it is determined that the first controller 260 from which the operation data is acquired is malfunctioning ("NO" in FIG. 7). In the present specification, the term "malfunction" refers to at least one of the following cases such as a hardware failure (breakage) and a failure to process an error due to conditions such as a data bug. The term "malfunction" may be simply referred to as a failure or an error. When it is determined that the first controller 260 is malfunctioning ("NO" in FIG. 7), a connection switching step S203 described later is performed. When the determination conditions are satisfied, it is determined that the first controller 260 from which the operation data is acquired is normally operating ("YES" in FIG. 7), and the control is continuously performed. For example, when the voltage for driving the first controller 260 in the operation data of the first controller 260a is lower than the predetermined second value, the first controller 260b determines that the first controller 260a is malfunctioning (that is, an error is occurred in the first controller 260a). In addition, when an error rate of the RAM 262a or the memory device 263a of the first controller 260a exceeds the predetermined first value, the first controller 260b determines that the first controller 260a is malfunctioning.

The first controller 260a may perform a self check process before the first controller 260a fails. When it is expected that the operation data exceeds the predetermined first value, it is determined that the first controller 260a is malfunctioning ("NO" in FIG. 7), and the connection switching step S203 may be performed. In addition, when it is determined that the first controller 260a is malfunctioning, for example, the first controller 260b may notify the input/output device 269b of a control request of the substrate processing apparatus 100a. A confirmation screen (window) 275 configured to confirm whether or not to issue the connection request as shown in FIG. 9 may be displayed using the input/output device 269b.

<Connection Switching Step S203>

When it is determined that the first controller 260 such as the first controller 260a is malfunctioning, the connection switching step S203 of switching the connection between the failed first controller 260 and the normal second controller 280 to the connection between normal first controller 260 of another substrate processing apparatus 100 and the normal second controller 280 is performed. As shown in FIG. 7, the connection switching step S203 includes a connection request step S204 and a connection confirmation step S205. Each step will be described in detail.

<Connection Request Step S204>

In the switching request step S204, a connection request is issued from the first controller 260 of another substrate processing apparatus 100 to the second controller 280 to which the failed first controller 260 is connected. For example, the connection request is issued from the first controller 260b to the second controller 280a. In the present specification, the connection request may also be referred to as an "alternative control request". When the connection request is issued, the confirmation screen (window) 275 configured to confirm whether or not to issue the connection request as shown in FIG. 9 may be displayed. Alternatively, a connection request may be issued from the second controller 280a to the first controller 260b. When the connection request is issued from the second controller 280a, the confirmation screen (window) 275 configured to confirm whether or not to issue the connection request as shown in FIG. 9 may also be displayed.

A configuration of the confirmation screen 275 of the connection request (control request confirmation) shown in FIG. 9 will be described. The confirmation screen 275 of the connection request includes a YES button 275a configured to confirm the connection request and a NO button 275b configured to reject the connection request. As indicated by a broken line in FIG. 9, the confirmation screen 275 may further include a person call button 275c. The person call button 275c is configured to transmit a call request of a person in charge of the host apparatus 500 or the management device 274.

<Connection Confirmation Step S205>

In the connection confirmation step S205, when one of the second controller 280a and the first controller 260b receives the connection request, it is confirmed that whether or not a receiver of the connection request (that is, the above one of the second controller 280a and the first controller 260b) can connect with a sender of the connection request (that is, the other one of the second controller 280a and the first controller 260b). When it is determined that the connection to the sender of the connection request is possible ("YES" in FIG. 7), the control of the second controller 280 is performed by an alternative control step S207 described later. When it is determined that the connection to the sender of the connection request is impossible ("NO" in FIG. 7), the connection destination searching step S206 is performed. The confirmation in the connection confirmation step S205 may be performed by using the YES button 275a displayed on the confirmation screen shown in FIG. 9. In addition, the confirmation in the connection confirmation step S205 may be performed according to an operating state and a load state of the receiver of the connection request. For example, when the load state on the receiver of the connection request is high, it is determined that the connection to the sender of the connection request is impossible ("NO" in FIG. 7). In addition, when a timeout occurs after a predetermined time has elapsed since the connection request is transmitted or received, it is determined that the connection to the sender of the connection request is impossible ("NO" in FIG. 7).

After the confirmation in the connection confirmation step S205 is performed, a process such as a process of registering an IP address is performed between the first controller 260 that controls the second controller 280 and the second controller 280 that is controlled by the first controller 260. For example, when the confirmation between the first controller 260b and the second controller 280a is established, the next alternative control step S207 is performed.

<Connection Destination Searching Step S206>

Subsequently, the connection destination searching step S206 will be described. The connection destination searching step S206 is performed when it is determined that the connection to the sender of the connection request is impossible ("NO" in FIG. 7) in the connection confirmation step S205. In the connection destination searching step S206, a connection request is issued to another first controller 260 (for example, the first controller 260c) from one of the first controller 260b and the second controller 280a. The same connection confirmation as that in the connection confirmation step S205 described above is performed by the first controller 260c. When the connection confirmation is not established in the first controller 260c, a connection request is issued to the next first controller 260 (for example, the first controller 260d). When the connection confirmation is not established by all of the first controllers 260 connected to the network 268, a connection waiting process is performed by one of the first controllers 260. In addition, a connection request may be transmitted to another apparatus connected to the network 268. In the embodiments, the term "another apparatus" may refer to, for example, an apparatus such as the management device 274 and the host apparatus 500.

<Alternative Control Step S207>

Figure 8:
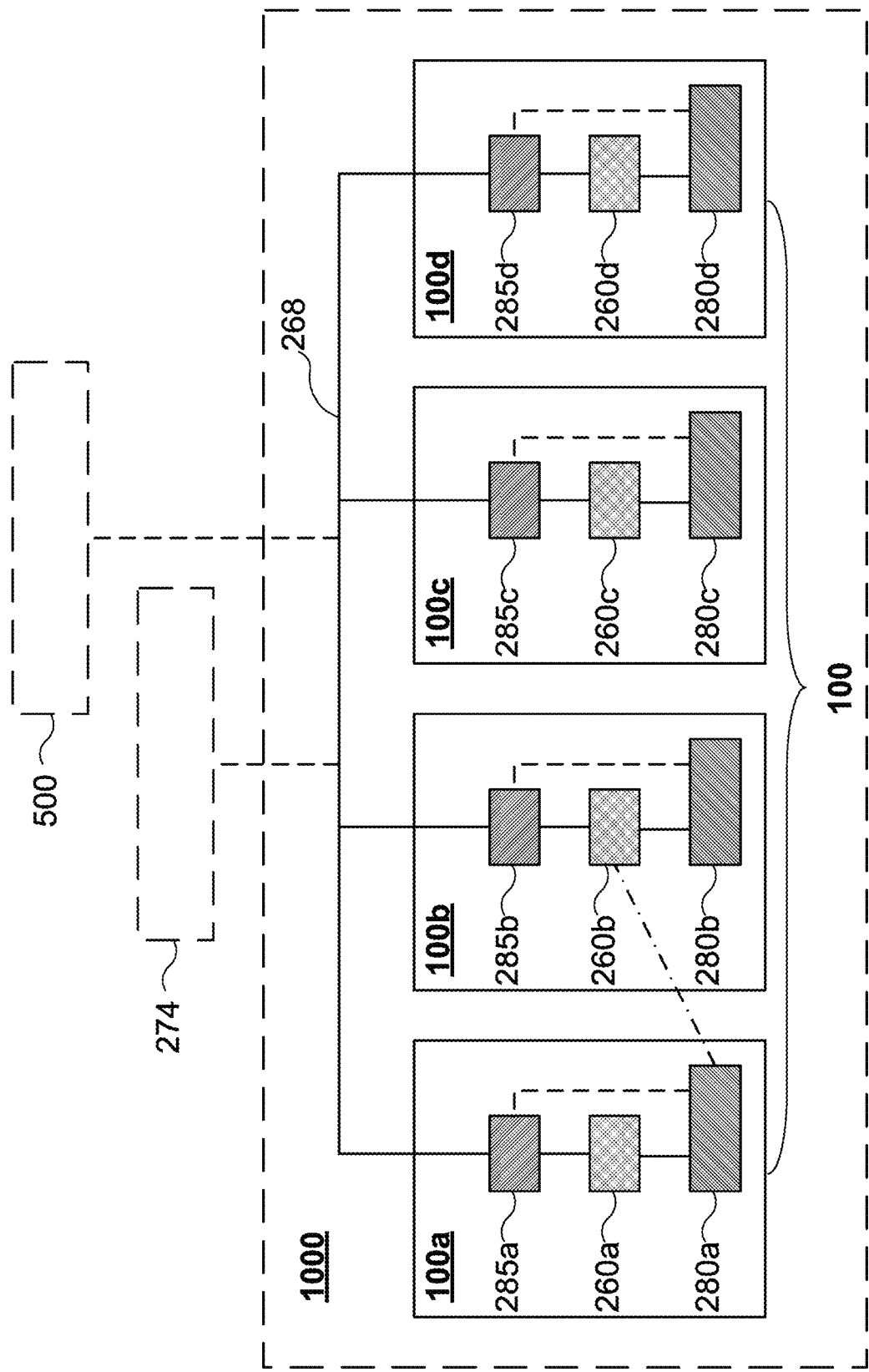
FIG. 8 schematically illustrates a configuration of the substrate processing system during an alternative control of the controller.

In the alternative control step S207, the control (operation) of one substrate processing apparatus 100 is performed by another substrate processing apparatus 100. For example, as shown by a dashed line in FIG. 8, when the first controller 260b and the second controller 280a are connected and the connection confirmation is established, the control (operation) of the second controller 280a may be performed by the first controller 260b. That is, the substrate processing apparatus 100a can be operated by the first controller 260b. In the alternative control step S207, the operations that can be performed the first controller 260b may include, for example, the operations of the components provided in the substrate processing apparatus 100a, the execution of the substrate processing by the substrate processing apparatus 100a and a maintenance process of maintaining the substrate processing apparatus 100a.

After switching the connection between the failed first controller 260 and the normal second controller 280 to the connection between normal first controller 260 of another substrate processing apparatus 100 and the normal second controller 280 by performing the connection switching step S203, the maintenance process of the failed first controller 260 such as the first controller 260a may be performed. In the maintenance process, for example, at least one of processes such as a restarting process of the first controller 260a, a replacement process of replacing components constituting the first controller 260a and a exchange process of exchanging the first controller 260a itself may be performed.

During the maintenance process described above, the latest information data such as the latest setting data of the components of the substrate processing apparatus 100, the latest control program and the latest process recipe may be transmitted from the host apparatus 500 to the first controller 260a under the maintenance process. Since the first controller 260a is malfunctioning or under the maintenance process, it is impossible for the first controller 260a to download the latest information data described above. In such a case, the first controller 260b may alternatively download and store (record) the latest information data in the memory device 263b provided in the first controller 260b and transmit the latest information data to the first controller 260a after detecting that the first controller 260a returns to a normal state (that is, first controller 260a recovers to the normal state). In the embodiments, the term "normal state" refers to a state in which it is determined that the first controller 260a is normally operating ("YES" in FIG. 7) in the determination step S202 described above. In addition, the first controller 260b may keep (hold) presence/absence data of the latest information data describe above. After detecting that the first controller 260a returns to the normal state, the first controller 260b may transmit instruction data to the first controller 260a. The first controller 260a may request the host apparatus 500 to download the latest information data based on the instruction data.

Other Embodiments

While the technique is described in detail by way of the above-described embodiments, the above-described technique is not limited thereto. The above-described technique may be modified in various ways without departing from the gist thereof.

For example, the above-described embodiments are described by way of an example in which the substrate 200 is processed as one of the manufacturing processes of the semiconductor device. However, the above-described technique is not limited thereto. For example, the above-described technique may be applied to other substrate processing such as manufacturing processes of a liquid crystal device, manufacturing processes of a solar cell, manufacturing processes of a light emitting device, and a substrate processing of a glass substrate, a ceramic substrate or a conductive substrate.

For example, the above-described embodiments are described by way of an example in which the silicon nitride film is formed using the silicon-containing gas as a source gas (first process gas) and the nitrogen-containing gas as a reactive gas (second process gas). However, the above-described technique is not limited thereto. The above-described technique may be applied to the formations of other films using different gases. For example, the above-described technique may also be applied to formations of an oxygen-containing film, a nitrogen-containing film, a carbon-containing film, a boron-containing film, a metal-containing film and combinations thereof. For example, the above-described technique may also be applied to formations of an aluminum oxide (AlO) film, a zirconium oxide (ZrO) film, a hafnium oxide (HfO) film, a hafnium aluminum oxide (HfAlO) film, a zirconium aluminum oxide (ZrAlO) film, a silicon carbide (SiC) film, a silicon carbonitride (SiCN) film, a silicon boronitride (SiBN) film, a titanium nitride (TiN) film, a titanium carbide (TiC) film and a titanium aluminum carbide (TiAlC) film.

For example, the above-described embodiments are described by way of an example in which the substrate processing apparatus capable of processing one substrate in one process chamber is used. However, the above-described technique is not limited thereto. The above-described technique may be applied to other substrate processing apparatuses. For example, the above-described technique may also be applied to a substrate processing apparatus capable of processing a plurality of substrates arranged horizontally or vertically.

According to some embodiments in the present disclosure, it is possible to manage the substrate processing apparatus efficiently.

What is claimed is:

1. A substrate processing apparatus comprising:
   process performing parts configured to process a substrate based on a program;
   a first controller configured to process the program; and
   a second controller configured to control the process performing parts based on data received from the first controller,
   wherein the first controller is further configured to: (i) determine whether or not a first controller provided in an additional substrate processing apparatus is malfunctioning based on operation data of the first controller provided in the additional substrate processing apparatus, (ii) perform an alternative control for the first controller provided in the additional substrate processing apparatus and control process performing parts provided in the additional substrate processing apparatus via a second controller provided in the additional substrate processing apparatus when it is determined that the first controller provided in the additional substrate processing apparatus is malfunctioning, and
   wherein the first controller is further configured to transmit, to the second controller provided in the additional substrate processing apparatus, a connection request related to an alternative control of the second controller provided in the additional substrate processing apparatus, and to display a screen to confirm whether or not to issue the connection request.

2. The substrate processing apparatus of claim 1, wherein the first controller comprises an input/output device, and
   the first controller is further configured to notify the input/output device of a control request of the additional substrate processing apparatus when it is determined that the first controller provided in the additional substrate processing apparatus is malfunctioning.

3. The substrate processing apparatus of claim 2, wherein the first controller comprises a memory device, and
   the first controller is further configured to periodically record apparatus data of the first controller provided in the additional substrate processing apparatus in the memory device.

4. The substrate processing apparatus of claim 3, wherein the first controller is further configured to receive latest information data on the additional substrate processing apparatus while performing the alternative control for the first controller provided in the additional substrate processing apparatus.

5. The substrate processing apparatus of claim 4, wherein the first controller is further configured to transmit the latest information data to the first controller provided in the additional substrate processing apparatus when the first controller provided in the additional substrate processing apparatus returns to a normal state.

6. The substrate processing apparatus of claim 5, wherein the first controller is further configured to, when the alternative control for the first controller provided in the additional substrate processing apparatus is impossible, transmit an alternative control request to one or both of a first controller provided in a third substrate processing apparatus and a host apparatus.

7. The substrate processing apparatus of claim 4, wherein the first controller is further configured to control the second controller provided in the additional substrate processing apparatus during the alternative control.

8. The substrate processing apparatus of claim 2, wherein the first controller is further configured to receive latest information data on the additional substrate processing apparatus while performing the alternative control for the first controller provided in the additional substrate processing apparatus.

9. The substrate processing apparatus of claim 8, wherein the first controller is further configured to transmit the latest information data to the first controller provided in the additional substrate processing apparatus when the first controller provided in the additional substrate processing apparatus returns to a normal state.

10. The substrate processing apparatus of claim 2, wherein the first controller is further configured to control the second controller provided in the additional substrate processing apparatus during the alternative control.

11. The substrate processing apparatus of claim 1, wherein the first controller comprises a memory device, and
the first controller is further configured to periodically record apparatus data of the first controller provided in the additional substrate processing apparatus in the memory device.

12. The substrate processing apparatus of claim 11, wherein the first controller is further configured to control the second controller provided in the additional substrate processing apparatus during the alternative control.

13. The substrate processing apparatus of claim 1, wherein the first controller is further configured to receive latest information data on the additional substrate processing apparatus while performing the alternative control for the first controller provided in the additional substrate processing apparatus.

14. The substrate processing apparatus of claim 13, wherein the first controller is further configured to transmit the latest information data to the first controller provided in the additional substrate processing apparatus when the first controller provided in the additional substrate processing apparatus returns to a normal state.

15. The substrate processing apparatus of claim 1, wherein the first controller is further configured to control the second controller provided in the additional substrate processing apparatus during the alternative control.

16. The substrate processing apparatus of claim 1, wherein the first controller is further configured to, when the alternative control for the first controller provided in the additional substrate processing apparatus is impossible, transmit an alternative control request to one or both of a first controller provided in a further additional substrate processing apparatus and a host apparatus.

17. The substrate processing apparatus of claim 1, wherein the connection request is transmitted from the first controller directly to the second controller provided in the additional substrate processing apparatus.

18. The substrate processing apparatus of claim 17, wherein the first controller is configured to determine that the first controller provided in the additional substrate processing apparatus is malfunctioning if at least one of determination conditions is not satisfied,
wherein the determination conditions comprise:
(a) whether or not the operation data exceeds a predetermined first value;
(b) whether or not the operation data is lower than a predetermined second value;
(c) whether or not the operation data includes predetermined contents; and
(d) whether or not the operation data has been acquired.

19. The substrate processing apparatus of claim 1, wherein the operation data comprises at least one among: a load state, number of errors occurred, an operation time and a temperature of at least one of a CPU, a RAM and a memory device of the first controller provided in the additional substrate processing apparatus.

20. The substrate processing apparatus of claim 1, wherein the process performing parts comprise at least one among a heater, a flow rate controller, an exhaust system and a valve, and
the first controller is further configured to control at least one among a heater, a flow rate controller, an exhaust system and a valve provided in the additional substrate processing apparatus via the second controller provided in the additional substrate processing apparatus.

* * * * *